United States Patent [19]
Higgins

[11] Patent Number: 4,675,714
[45] Date of Patent: Jun. 23, 1987

[54] GAPLESS GATE CHARGE COUPLED DEVICE

[75] Inventor: J. Aiden Higgins, Westlake Village, Calif.

[73] Assignee: Rockwell International Corporation, El Segundo, Calif.

[21] Appl. No.: 750,657

[22] Filed: Jul. 1, 1985

Related U.S. Application Data

[63] Continuation-in-part of Ser. No. 466,441, Feb. 15, 1983.

[51] Int. Cl.$^4$ .................. H01L 29/78; G11C 19/28
[52] U.S. Cl. .......................... 357/24; 357/15; 377/63
[58] Field of Search ............. 357/15, 24; 377/57–63

[56] References Cited

U.S. PATENT DOCUMENTS

| | | | |
|---|---|---|---|
| 3,728,590 | 4/1973 | Kim et al. .................. | 357/24 R |
| 4,089,023 | 5/1978 | Losehand .................. | 357/24 LR |
| 4,168,444 | 9/1979 | Van Santen .................. | 357/24 LR |
| 4,245,233 | 1/1981 | Lohstroh .................. | 357/24 LR |
| 4,264,915 | 4/1981 | Bierhenke et al. .................. | 357/24 M |
| 4,285,000 | 8/1981 | Deyhimy et al. .................. | 357/24 M |

OTHER PUBLICATIONS

Malaviya "Charge–Coupled Device Using Polycrystalline Silicon Gate Structure" IBM Tech. Disclosure Bulletin, vol. 16 (7/73) p. 635.

Primary Examiner—Gene M. Munson
Attorney, Agent, or Firm—H. Fredrick Hamann; Craig O. Malin

[57] ABSTRACT

Thin electrodes are coupled to a resistive film on an active semiconductive layer to form a gapless gate CCD (GGCCD). The active layer is formed on a semi-insulating substrate, and the resistive film is joined to the active layer by a Schottky barrier. The thin electrode coupled to the resistive film induce fringing fields near the surface to provide high speed charge transport and permit the use of a thin active layer.

8 Claims, 6 Drawing Figures

GAPLESS GATE CHARGE COUPLED DEVICE

BACKGROUND OF THE INVENTION

This is a continuation-in-part of application Ser. No. 466,441, filed Feb. 15, 1983.

This invention relates to the field of solid state electronics and particularly to the field of charge coupled devices (CCDs).

High speed CCDs have many promising applications such as transversal filtering and matched filtering for communication, signal multiplexing and de-multiplexing, and optical signal processing. However, the prospect of high speed CCDs as promised by early GaAs CCD development was compromised by the incompatibility of the CCD structure with the generally accepted field effect transistor (FET) integrated circuit with which it must be matched in order to find application. In particular, the electrical properties of the material forming the CCD channel were not ideal for forming the FET support circuitry such as clock drivers, pulse generators, and sample-and-hold capacitive electrode structures. The thick (approximately 1 um), and moderately doped (approximately $10^{16}/cm^3$) prior art CCD active layer was not useable for digital or analog support circuitry. Additionally, the need for dense circuitry demands a planar technology such as localized implantation, but it is exceedingly difficult to satisfactorily implant a deep layer.

Prior art CCDs consist of long metal electrodes separated by narrow gaps to form the individual cells along the active channel layer. A silicon CCD structure has been reported (The Bell System Technical Journal, Vol. 52, No. 5, May-June 1973, pp. 669-696) in which 10 um long electrodes separated by 5 um gaps were formed on an $SiO_2$ dielectric on a silicon substrate. The gaps between the electrodes were filled with a resistive material placed on top of the $SiO_2$ dielectric so that the potential drop between the plates would be essentially linear. The reported structure still does not eliminate problems associated with interelectrode gaps nor provide fringing electric fields which permit the use of thin active channel layers.

SUMMARY OF THE INVENTION

It is an object of the invention to provide a charge coupled device (CCD) which is gapless.

It is an object of the invention to provide a CCD which has high speed.

It is an object of the invention to provide a CCD with a thin active layer and a moderate pinch-off voltage.

It is an object of the invention to provide a CCD which is compatible with field effect transistor (FET) support integrated circuitry on the surface of the CCD chip.

It is an object of the invention to provide a CCD which has improved charge utilization.

According to the invention, a thin, active layer of semiconducting material such as doped GaAs is formed on a semi-insulating substrate such as semi-insulating GaAs. A resistive film is deposited on the upper surface of the active layer and joined to the active layer by a Schottky barrier. This resistive film can be a cermet (ceramic-metal) which is deposited by sputtering. Thin metal electrodes are positioned along the resistive layer to form the cells of a gapless gate charge coupled device (GGCCD).

The thin electrodes coupled to the resistive film induce fringing fields near the surface to assure high speed charge transport and to permit the use of a thin active layer.

In one embodiment of the invention, the metal electrodes which form the cells are located on the top surface of the resistive film.

In another embodiment, thin metal electrodes are formed on the top surface of the active layer and are joined to the active layer with a Schottky barrier.

An ohmic contact and gate are provided to inject charge into the first cell in the active layer. Similarly, an ohmic contact and gate are provided for receiving charge from the last cell in the active layer.

These and other objects and features of the invention will be apparent from the following detailed description, taken with reference to the accompanying drawings.

DESCRIPTION OF THE PREFERRED EMBODIMENT

Figure 1:
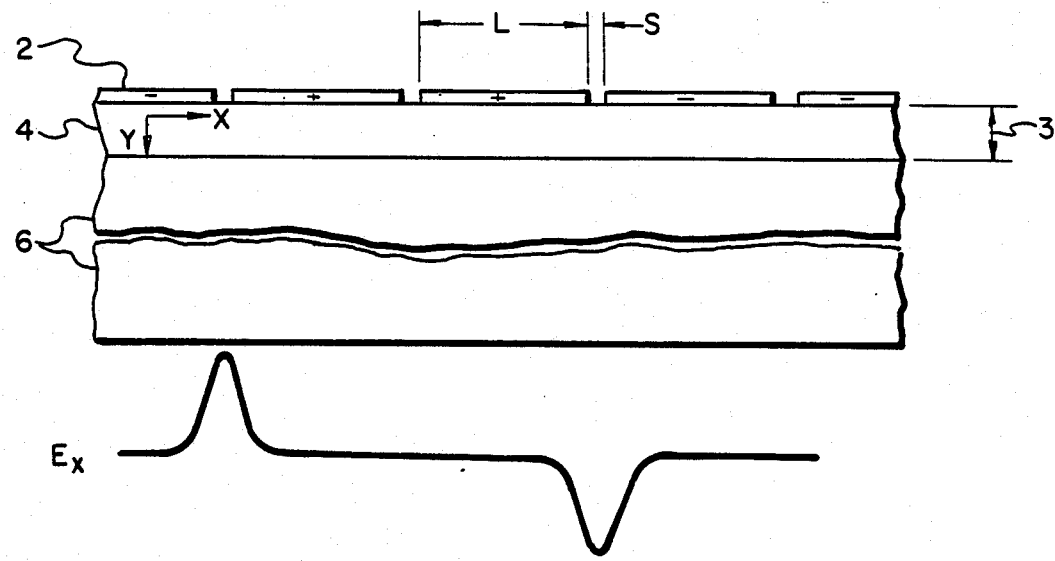
FIG. 1 is a schematic cross-section of a portion of a CCD according to the prior art. Shown below the schematic is a plot of the electric field, Ex, in the active layer of the device along the length (x-direction) of the CCD.

FIG. 1 shows the form of a buried channel Schottky barrier capacitive gate charge coupled device (CCD) according to the prior art. The dominant feature of the electrode system is the metal electrodes 2 separated by small spaces, S. Electrodes 2 are long, L, in the direction of travel of the electrons (the x-direction). The ratio of the electrode length to the space (the aspect ratio) is much greater than 1 (L/S>>1), for example 2 or greater.

The electric field, Ex, in the x direction is also sketched in FIG. 1 for a position at a shallow depth, y, below the electrode. The electric field is very small over most of the x direction, being large only at the spaces. The important result of this geometry is that the fringing field in the x-direction is forced to be small at the surface. The potential well minimum must be designed to be a substantial distance, Y, from the electrode surface so that it may experience a sufficient field (Ex) in order to move bunches of electrons along quickly. Consequently, in prior art CCDs where high speed is needed, the thickness 3 of active layer 4 on substrate 6 must be sufficient (for example, over 1 um) to provide a potential well at a depth below the surface where the fringing fields have a useful strength.

Figure 2:
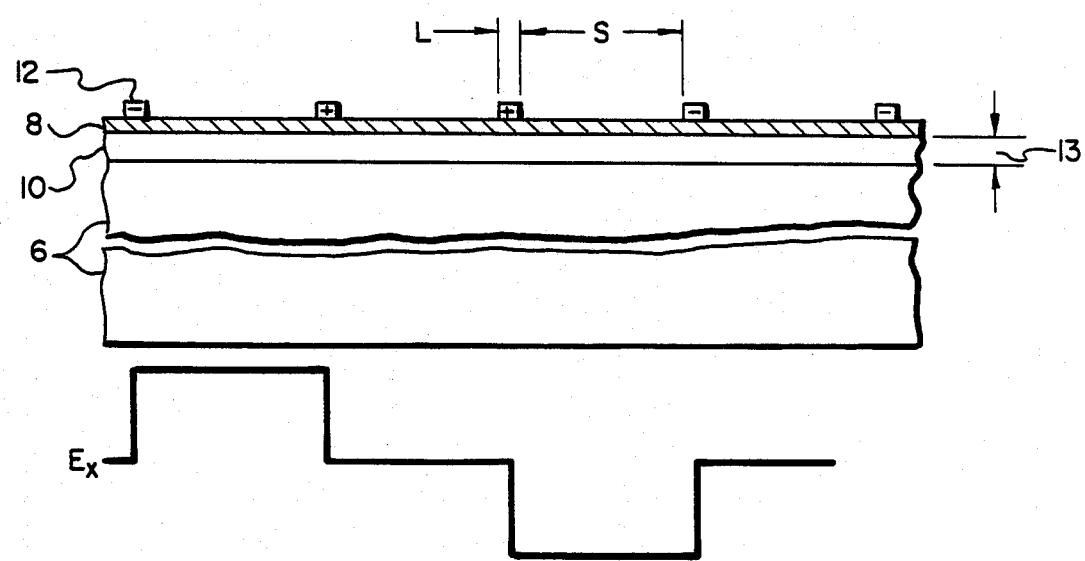
FIG. 2 is a schematic, cross-section of a portion of a CCD according to the first embodiment of the invention. Shown below the schematic is a plot of the electric field, Ex, in the active layer of the device along the length (x-direction) of the CCD.

The present invention utilizes a new electrode system which provides fringing fields, Ex, near the electrode surface that are more suitable for driving the electron bunches down their path in the active layer. As shown in FIG. 2, the new structure includes a one-piece, high resistance membrane or film 8 as the actual gate. Resistive film 8 is joined to active layer 10 by a Schottky barrier. Narrow electrodes 12 are formed on the resistive film 8 to provide the clocking voltage. Space S does not need to be as small as in prior art CCDs, and for ease of fabrication is generally over 2 um. Consequently, the ratio of the electrode length to space S is much less than 1, $L/S \ll 1$ (for example, less than $\frac{1}{2}$). The resistive film forms a continuous gate, and hence the device is gapless. Potential waves induced by the electrodes travel along the film over many cells. The action of this resistive film, coupled with the radically changed aspect ratio (L/S) of the metal electrodes, is to induce travelling waves of fringing fields, Ex, of sufficient magnitude near the surface to assure high speed charge tranport.

In the gapless CCD, the electric field near the surface, Ex, is high for the entire distance between the centers of electrodes at different potentials (FIG. 2). These extended high fields close to the surface are more suitable for pushing electron bunches in thin layers along the x-direction at high speed than are the narrow electric field regions in the gap between electrodes of prior art CCDs (FIG. 1).

Figure 3:
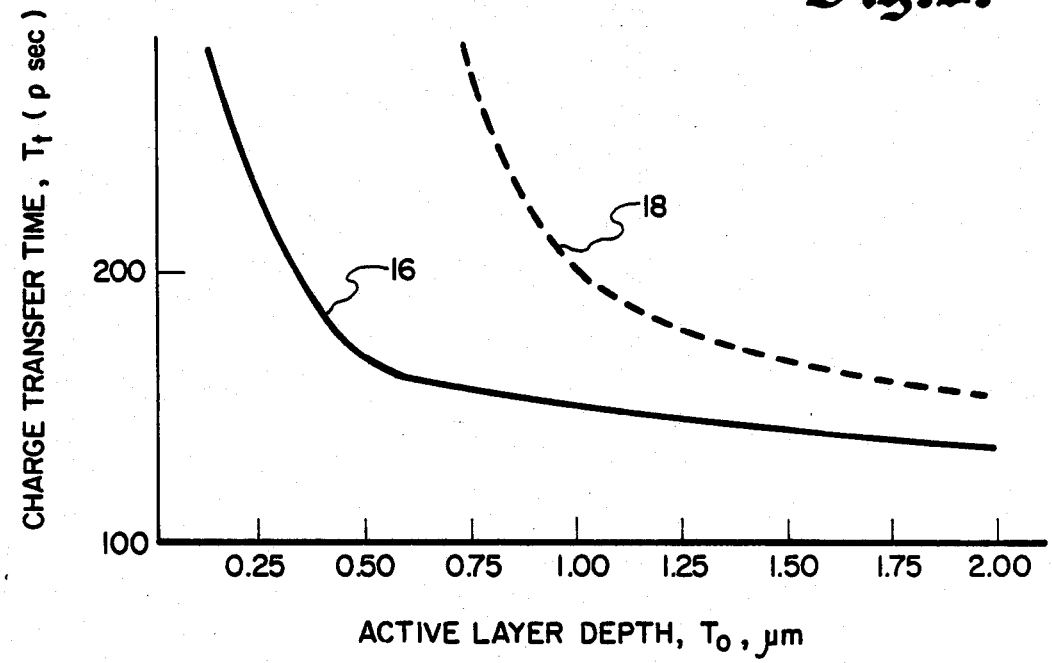
FIG. 3 is a plot of the charge transfer time vs active layer depth for a prior art CCD and for a gapless CCD.

In FIG. 3, the calculated high speed performance of CCDs having 5 um long cells is compared. Curve 16 shows the performance of a gapless CCD having 4 um spacing between adjacent 1 um long electrodes. Curve 18 shows the performance of a prior art CCD having 4 um long electrodes separated by 1 um gaps. These curves are for GaAs devices where it is assumed that the $u=4,000$ cm$^2$/Vsec and the threshold for velocity saturation E is 3300 V/cm. These curves show the manner in which charge transfer time from one emptying well to another filling well is dependent upon the depth of the potential well below the electrode surface.

A striking feature of these curves is that the gapless CCD (curve 16) maintains its high speed charge transfer time at much thinner depths than does the comparable prior art CCD (curve 18). For well depths of about 1 um or more, there is little advantage in speed between the two structures. However, in very thin active layers, the gapless CCD provides a substantial improvement. Consequently, the thickness 13 of the active layer 10 of the gapless CCD can be less than the thickness 3 of prior art CCDs.

Figure 4:
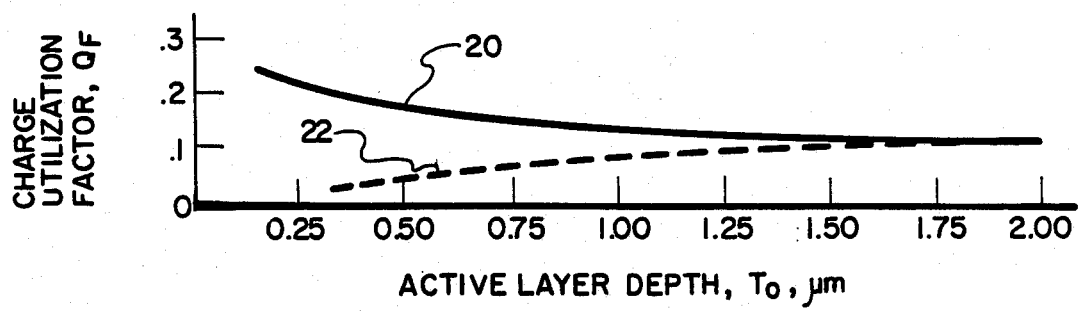
FIG. 4 is a plot of the charge utilization factor vs active layer depth for a prior art CCD and for a gapless CCD.

In prior art CCDs, the interelectrode space is a source of trouble both in processing and in device performance. Perhaps the greatest effect of the space is to diminish the available maximum well charge package, Qm. Consequently, space S is made as small as possible, generally less than 2 um, thus creating processing difficulties. This problem is overcome by the gapless nature of the new CCD. Calculations showing the stored charge under two electrodes of a four phase system as a function of the depth are shown in FIG. 4. The 0 Factor is stored charge divided by volume times doping level. Curve 20 is for a gapless CCD and curve 22 is for a prior art CCD having a 1 um gap such as previously described for FIG. 3. Neither the gapless nor the prior art CCDs approach a 1 $Q_F$ (100%) because they are devices that deliberately induce fields for high speed. However, the $Q_F$ of the gapless CCD is much better than for the capacitive gate CCD with 1 um gaps for very thin layers.

The fact that gapless CCDs can operate with a thin active layer is most desirable. It is clear that when high speed (electrons moving at over 10$^6$ cm/sec) CCDs are utilized they must be designed to be monlithically combined with field effect transistor (FET) support circuitry (clock drivers, etc.) on the same chip. The active layers of the FETs must be optimized for best performance which requires thin layers (less than 0.3 um) with high doping levels ($1 \times 10^{17}$ to $2 \times 10^{17}$ per cm$^3$). However, the prior art CCD structure requires a 1 to 2 micron thick active layer that is quite different from the FET layer. The gapless CCD provided by the present invention overcomes this compatability problem by providing a thin (less than 0.3 um) active layer (doped in the range of $1 \times 10^{17}$ to $2 \times 10^{17}$ per cm$^3$), which is suitable for both the CCD channel and the supporting circuit. This compatability of the active layer greatly simplifies the fabrication of CCDs on monolithic chips.

In addition to being compatible with FETs, thin active layers provide a greater dynamic range (for the same pinch-off voltage), greater ease of fabrication, and a greater immunity from bulk trapping effects.

The improved fabricability of gapless CCDs is a considerable advance by itself. This is because only epitaxial processes have the proven ability to make the thick, low-doped layers with a low number of bulk traps as required for prior art CCDs. The task of providing two (or more) different active layers in a planar IC using an epitaxial layer approach is very difficult. In contrast, the thin layers used in gapless CCDs can be fabricated using either epitaxial or implantation processes, and a single layer can be used for both the support circuitry and for the charge transfer channel. Gapless CCDs and FETs have been produced on active layers that were directly implanted into a melt grown GaAs substrate held at 25° C.

The resistive film can be fabricated using cermet materials which can be constituted to provide a broad range of resistivity. The resistive nature of the film is subject to certain practical limits. First the upper limit of resistance (per square) is set by the need to achieve a 1 GHz clocking rate. It is estimated that this upper limit is approximately 3M $\Omega/\square$ depending upon the devic geometry. The lower limit of resistivity is determined by the need to avoid the onset of thermal problems and is felt to be about 0.05M $\Omega/\square$.

Resistive films have been fabricated using a 3000 Å layer of cermet material having a resistivity of 1 to 2 M $\Omega/\square$. The cermet was a Cr/SiO composition obtained by sputtering a 20/80% Cr:SiO target. The Schottky barrier potential obtained with this cermet film on an n layer on an n+ GaAs substrate was about 1.09 volts. Of course, other resistive materials can be used and optimum conditions established for particular devices using techniques within the skill of the artisan.

Figure 5:
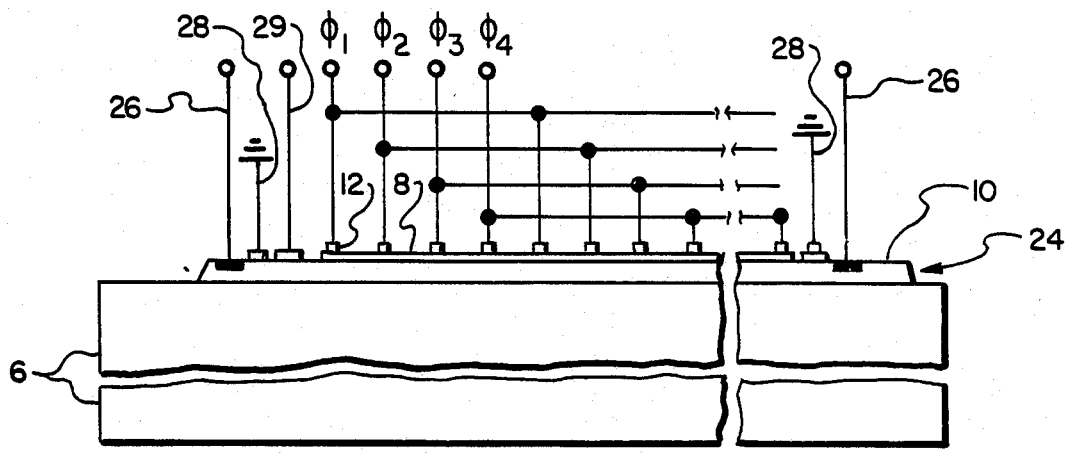
FIG. 5 is a schematic cross section of a CCD utilizing a gapless structure such as shown in FIG. 2.

FIG. 5 is a schematic of a four phase gapless CCD. A mesa structure 24 is used to isolate active layer 10 on substrate 6 although other isolation techniques such as proton bombardment can be used. A four phase clocking signal drives electrodes 12. Ohmic contacts 26 and gates 28, 29 are provided at both ends of the channel for injecting charge into and receiving charge from the active layer. With a resistive film of 1M $\Omega/\square$ and an active layer about 0.25 um thick, clocking speeds greater than 1 GHz can be obtained. The thickness and carrier concentration of the active layer can be exactly that which would be used for a moderate power level discrete or MMIC FET. Because of its gapless nature, the charge utilization factor ($Q_F$) of this CCD is considerably better than that of conventional CCDs.

Figure 6:
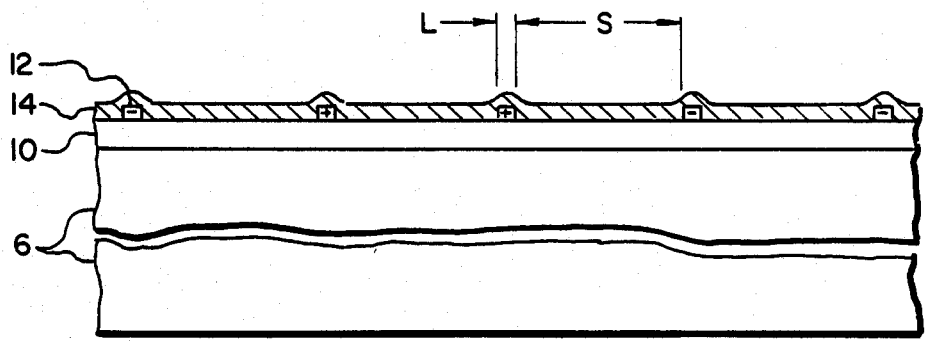
FIG. 6 is a schematic, cross-section of a portion of a CCD according to a second embodiment of the invention.

A second embodiment of the invention is shown in FIG. 6 wherein narrow electrodes 12 are joined directly to active layer 10 by means of a Schottky barrier. Resistive film 14 is formed over both the electrodes and the active layer, and is joined to the active layer by a Schottky barrier. The electric field, $E_x$, obtained using this second embodiment is similar to that shown in FIG. 2.

Numerous variations and modifications can be made without departing from the invention. For example, substrates can be made from materials other than GaAs, and can be insulating, semi-insulating, or even semi-conducting. Similarly, active layers can be made from materials other than GaAs, an example of which would be the ternary compound, $Al_xGa_{1-x}As$ and other III-V compounds. If semiconducting substrates are used, then the substrate should be reverse biased and should be a conductivity type opposite that of the active layer. For some optical applications, the substrate can be completely removed by etching during processing.

Resistive films can be formed of materials other than Cr/SiO cermets and applied by techniques other than by sputtering. Transparent resistive films can be used in order to pass photons through the active layer for optical applications. Emperical and analytical techniques well within the skill of the artisan can be used to optimize materials and dimensional features of the gapless CCD for specific applications. Although the invention has been described for a four phase CCD, it is also suitable for three and two phase CCDs. Accordingly, it should be understood that the form of the invention described above is illustrative only and is not intended to limit the scope of the invention.

What is claimed is:

1. A high speed gapless gate charge transfer channel comprising:
    a semi-insulating compound substrate;
    an active layer on said substrate, said active layer being less than about 0.3 um thick and having a high doping level suitable for a FET;
    a resistive film joined to a surface of said active layer by a Schottky barrier; and
    short conductive electrodes spaced along said resistive films to form cells of said charge transfer channel, the ratio of the length of said electrodes and the space between them (L/S) being less than about ½, said resistive film extending continuously between said conductive electrodes, whereby a gapless charge transfer channel is provided between said cells.

2. The charge transfer channel as claimed in claim 1, wherein said conductive electrodes are positioned on the surface of said resistive film opposite said active layer.

3. The charge transfer channel as claimed in claim 1, wherein said conductive electrodes are positioned on the same surface of said active layer as said resistive film and are joined to said active layer by a Schottky barrier.

4. The charge transfer channel as claimed in claim 1, wherein said substrate comprises a semi-insulating GaAs substrate.

5. A high-speed, gapless gate charge coupled device comprising:
    a semi-insulating compound substrate;
    an active layer on said substrate, said active layer being less than about 0.3 um thick and having a high doping level suitable for a FET;
    a resistive film joined to the upper surface of said active layer by a Schottky barrier;
    short conductive electrodes spaced along the upper surface of said resistive film to form the cells of said charge coupled device, the ratio of the length of said electrodes and the space between them (L/S) being less than about ½, said resistive film extending continuously along said active layer to provide a gapless charge transfer channel between said cell;
    means for injecting charge into said active layer; and
    means for receiving charge from said active layer.

6. The charge coupled device as claimed in claim 5, wherein said substrate comprises a semi-insulating GaAs substrate.

7. A high speed, gapless gate charge coupled device comprising:
    a semi-insulating compound substrate;
    an active layer on said substrate, said active layer being less than about 0.3 um thick and having a high doping level suitable for a FET;
    a resistive film joined to the upper surface of said active layer by a Schottky barrier;
    short conductive electrodes spaced along the upper surface of said active layer and joined to said active layer by a Schottky barrier to form the cells of said charge coupled device, the ratio of the length of said electrodes and the space between them (L/S) being less than about ½, said resistive film extending continuously between said conductive electrodes to provide a gapless charge transfer channel between said cells;
    means for injecting charge into said active layer; and
    means for receiving charge from said active layer.

8. The charge coupled device as claimed in claim 7, wherein said substrate comprises a semi-insulating GaAs substrate.

* * * * *